(12) United States Patent
Farley et al.

(10) Patent No.: US 9,680,492 B1
(45) Date of Patent: Jun. 13, 2017

(54) THRESHOLD DETECTION WITH DIGITAL CORRECTION IN ANALOG TO DIGITAL CONVERTERS

(71) Applicant: Xilinx, Inc., San Jose, CA (US)

(72) Inventors: Brendan Farley, Donabate (IE);
Christophe Erdmann, Dublin (IE)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 15/246,369

(22) Filed: Aug. 24, 2016

(51) Int. Cl.
*H03M 1/12* (2006.01)
*H03M 1/38* (2006.01)

(52) U.S. Cl.
CPC ........... *H03M 1/1245* (2013.01); *H03M 1/38* (2013.01)

(58) Field of Classification Search
CPC .... H03M 1/1245; H03M 1/38; H03M 1/0682; H03M 1/466
USPC ................. 341/155, 161, 163, 172
See application file for complete search history.

(56) References Cited

U.S. PATENT DOCUMENTS

| | | | |
|---|---|---|---|
| 6,246,258 B1 | 6/2001 | Lesea | |
| 6,351,145 B1 | 2/2002 | Lesea | |
| 6,707,403 B1 * | 3/2004 | Hurrell | H03M 1/1061 341/120 |
| 6,784,824 B1 | 8/2004 | Quinn | |
| 7,138,815 B1 | 11/2006 | Alexander et al. | |
| 7,378,999 B1 | 5/2008 | McGrath et al. | |
| 8,497,795 B2 * | 7/2013 | Le Tual | H03M 1/468 341/155 |
| 8,766,832 B1 | 7/2014 | Bogue | |
| 8,786,484 B2 * | 7/2014 | Cheong | H03M 1/0682 341/155 |
| 8,970,419 B2 | 3/2015 | Farley et al. | |
| 9,048,860 B1 | 6/2015 | Quinn | |

* cited by examiner

*Primary Examiner* — Khai M Nguyen
(74) *Attorney, Agent, or Firm* — Robert M. Brush; Keith Taboada

(57) ABSTRACT

An analog to digital converter (ADC) includes a comparator and a plurality of capacitor pairs coupled between first and second inputs the comparator, where each one of the capacitor pairs corresponds to one of a plurality of cycles used by the ADC to generate a digital value representing a sampled analog voltage. The ADC also includes a voltage detection circuit and a state machine that is configured to, upon determining during a first cycle that the sampled voltage across the first and second inputs satisfies a threshold, maintaining a first pair of the plurality of capacitor pairs in a default state such that the sampled analog voltage is unchanged. Otherwise, the state machine is configured to switch the first pair of the plurality of capacitor pairs to change the sampled analog voltage.

20 Claims, 7 Drawing Sheets

US 9,680,492 B1

THRESHOLD DETECTION WITH DIGITAL CORRECTION IN ANALOG TO DIGITAL CONVERTERS

TECHNICAL FIELD

Examples of the present disclosure generally relate to electronic circuits and, in particular, to an analog to digital converter (ADC) having a low voltage detection circuit.

BACKGROUND

An analog input signal received at an ADC can have an amplitude that can vary widely relative to the full scale range of the signal. In many wireless applications, the amplitude of an input signal can fall −2 dB to −40 dB of the full scale range (i.e., 80% to 1% of the maximum amplitude). It is difficult to design an ADC that can digitize an analog input signal with sufficient performance over the wide range of amplitudes. For example, if the ADC is used in a base station of a mobile phone network, if the ADC cannot accurately convert analog signals with smaller amplitudes, the operator may need to add additional base stations. Conversely, if the ADC can accurately convert signals that have amplitudes that are −40 dB of the full scale range, fewer base stations are needed.

SUMMARY

Techniques for providing an analog to digital converter (ADC) with a voltage detection circuit are described. The ADC includes a comparator and a plurality of capacitor pairs coupled between a first input and a second input of the comparator, where each one of the capacitor pairs corresponds to one of a plurality of cycles used by the ADC to generate a digital value representing a sampled analog voltage. The ADC also includes a voltage detection circuit coupled between the first and second inputs and a state machine configured to, upon determining during a first cycle of the plurality of cycles that the voltage detection circuit indicates the sampled analog voltage across the first and second inputs satisfies a threshold, maintaining a first pair of the plurality of capacitor pairs corresponding to the first cycle in a default state such that the sampled analog voltage is unchanged and, upon determining during the first cycle that the voltage detection circuit indicates the sampled analog voltage across the first and second inputs does not satisfy the threshold, switching the first pair of the plurality of capacitor pairs to change the sampled analog voltage.

One example described herein is an integrated circuit that includes a comparator and a plurality of capacitor pairs coupled between a first input and a second input of the comparator, where each one of the capacitor pairs corresponds to one of a plurality of cycles used to generate a digital value representing a sampled analog voltage. The integrated circuit also includes a voltage detection circuit coupled between the first and second inputs and a state machine configured to, upon determining during a first cycle of the plurality of cycles that the voltage detection circuit indicates the sampled analog voltage across the first and second inputs satisfies a threshold, maintaining a first pair of the plurality of capacitor pairs corresponding to the first cycle in a default state such that the sampled analog voltage is unchanged and, upon determining during the first cycle that the voltage detection circuit indicates the sampled analog voltage across the first and second inputs does not satisfy the threshold, switch the first pair of the plurality of capacitor pairs to change the sampled analog voltage.

One example described herein is a method that includes receiving a first sampled analog voltage at a first input and a second input of a comparator in an ADC, where a plurality of capacitor pairs are coupled between the first and second inputs of the comparator, and where each one of the capacitor pairs corresponds to one of a first plurality of cycles used by the ADC to generate a digital value representing the first sampled analog voltage. The method also includes, upon determining during a first cycle of the first plurality of cycles that the first sampled analog voltage satisfies a threshold, maintaining a first pair of the plurality of capacitor pairs corresponding to the first cycle in a default state such that the first sampled analog voltage is unchanged. The method includes receiving a second sampled analog voltage at the first and second inputs of the comparator and, upon determining during a first cycle of a second plurality of cycles that the second sampled analog voltage does not satisfy the threshold, switching the first pair of the plurality of capacitor pairs to change the second sampled analog voltage.

BRIEF DESCRIPTION OF THE DRAWINGS

So that the manner in which the above recited features can be understood in detail, a more particular description, briefly summarized above, may be had by reference to example implementations, some of which are illustrated in the appended drawings. It is to be noted, however, that the appended drawings illustrate only typical example implementations and are therefore not to be considered limiting of its scope.

To facilitate understanding, identical reference numerals have been used, where possible, to designate identical elements that are common to the figures. It is contemplated that elements of one example may be beneficially incorporated in other examples.

DETAILED DESCRIPTION

Figure 1:
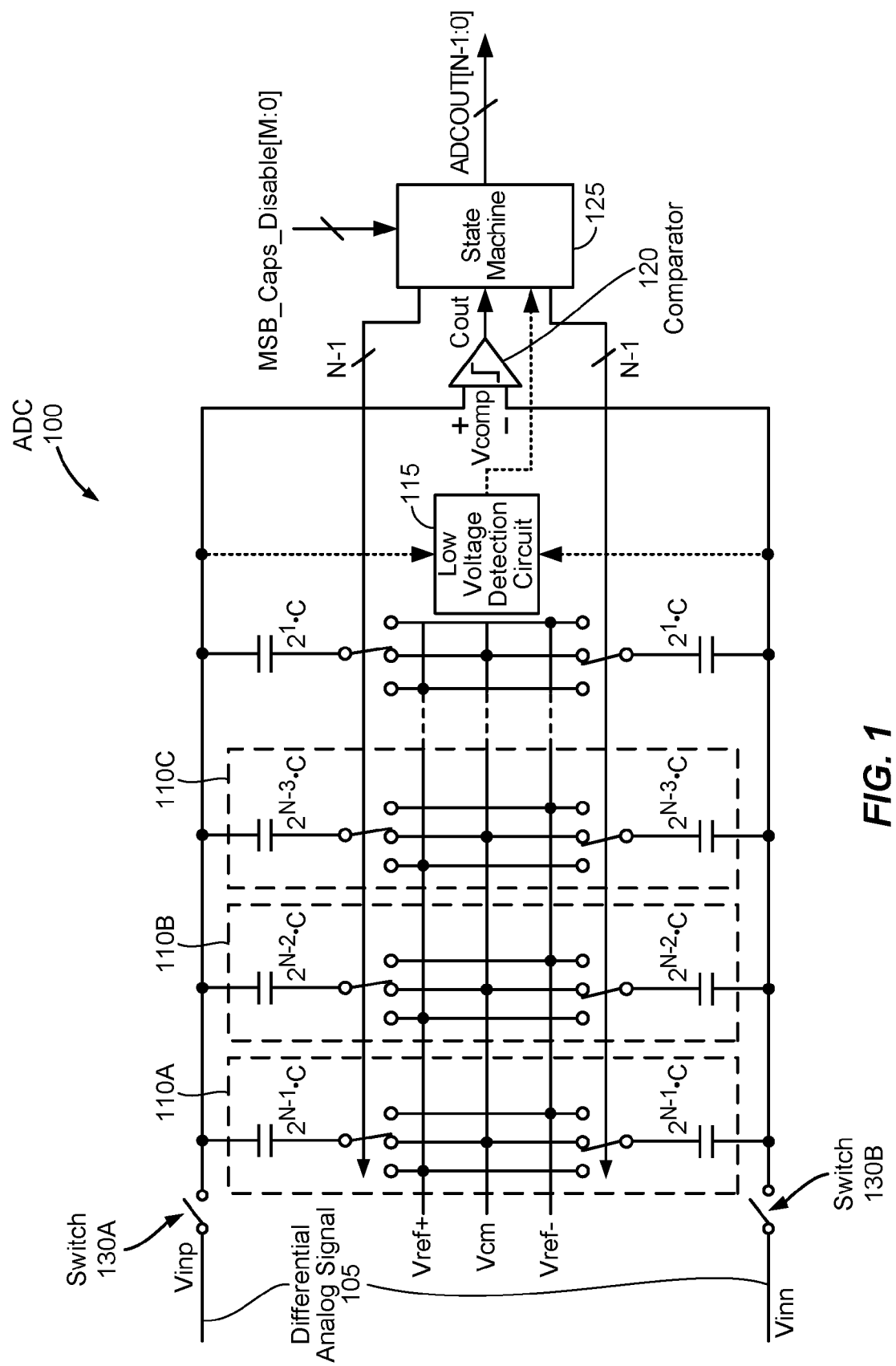
FIG. 1 is a schematic diagram of an ADC according to an example.

Various features are described hereinafter with reference to the figures. It should be noted that the figures may or may not be drawn to scale and that the elements of similar structures or functions are represented by like reference numerals throughout the figures. It should be noted that the figures are only intended to facilitate the description of the features. They are not intended as an exhaustive description of the description or as a limitation on the scope of the claims. In addition, an illustrated example need not have all the aspects or advantages shown. An aspect or an advantage described in conjunction with a particular example is not necessarily limited to that example and can be practiced in any other examples even if not so illustrated, or if not so explicitly described.

Techniques for providing an analog to digital converter (ADC) having a low voltage detection circuit are described. In some wireless applications, the amplitude of the received analog signal varies widely depending on the environment. For example, in a mobile cell network, the amplitude of received wireless signals varies depending on the distance between the receiver and the client device, the weather, interfering objects, and the like. Many ADCs struggle to accurately convert analog signals whose amplitudes vary widely.

A successive approximation register ADC (SAR ADC) uses N-cycles to generate an N-bit digital value representing a sampled voltage of an analog signal. In one example, during each cycle, the SAR ADC switches a pair of capacitors to either increase or reduce the sampled analog voltage. A comparator in the SAR ADC outputs either a logical one or zero during each cycle indicated whether the sampled voltage has a positive or negative polarity. Depending on the output of the comparator, a state machine in the SAR ADC determines how to couple the pair of capacitors corresponding to the next stage to either increase or decrease the sampled voltage.

Instead of relying solely on the polarity of the sampled voltage to determine how to switch the capacitor pairs in the next cycles, in one example the SAR ADC includes a low voltage detection circuit that determines if the sampled voltage falls within a voltage range (i.e., is between two voltage thresholds). If so, depending on the cycle, the state machine may keep the capacitor pair coupled to ground rather than using the capacitors to either increase or decrease the sampled voltage. That is, if the sampled voltage is within the voltage range, the SAR ADC does not alter the sampled voltage during the next cycle. However, if the detection circuit determines the sampled voltage is outside the voltage range, the state machine identifies the polarity of the sample voltage and switches the capacitor pair to change the sampled voltage as described above.

If the low voltage detection circuit determines the sampled voltage is within the voltage range and the voltage is not changed during a cycle, the state machine stores an indication in memory that digital correction is needed. That is, because the capacitors were not used to perform an analog operation on the sampled signal, after the digital value is determined, the state machine uses the stored indication to trigger a digital correction of the digital value. Thus, the resulting digital value is the same regardless of whether the low voltage detection circuit is used or not.

One advantage of using the low voltage detection circuit is that doing so can replace one or more analog operations with a digital operation. The accuracy of the analog operations may vary because the capacitors in the SAR ADC are not ideal (e.g., their capacitance may vary within a tolerance), the sampled voltage may not settle before the next cycle, charge injection, disturbances in a reference voltage, and/or temperature variations. However, performing a digital operation does not suffer from these variances which can introduce an error into the digital value.

FIG. 1 is a schematic diagram of an SAR ADC 100 according to an example. The ADC 100 (which can be disposed in an integrated circuit) includes a differential analog input 105, multiple capacitor pairs 110, a low voltage detection circuit 115, a comparator 120, and a state machine 125. The differential analog input 105 permits the ADC 100 to sample a differential analog signal (e.g., a received wireless or wired modulated signal) to output a corresponding a digital value representing the sampled analog voltage. By closing switches 130A and 130B (e.g., transistors), a sampled voltage of the analog signal is driven across capacitors pairs 110. This sampled voltage is also referred to as $V_{comp}$ which is the voltage across the first and second inputs of the comparator 120.

The comparator 120 outputs either a logical one or a logical zero depending on the polarity of $V_{comp}$. For example, if $V_{comp}$ has a negative polarity—e.g., is less than ground $V_{cm}$—the comparator 120 outputs a first digital value (e.g., a zero). If $V_{comp}$ has a positive polarity—i.e., is greater than ground—the comparator 120 outputs a second digital value (e.g., a one). As described in greater detail below, during each cycle, the state machine 125 stores the output of the comparator 120 and determines how to switch one pair of the capacitor pairs 110 such that sampled voltage is either increased or decreased during the next cycle. This process continues until all the pairs 110 of capacitors have been evaluated which results in an N-bit digital value stored in the state machine 125. The N-bit digital signal is the digital value (i.e., the resulting value) of the sampled analog voltage.

However, the addition of the low voltage detection circuit 115 in the SAR ADC 100 means that the state machine 125 does not necessarily have to switch the capacitor pair 110 during each cycle. As shown, the detection circuit 115 is coupled to both $V_{inp}$ and $V_{inn}$ (i.e., between the two inputs of the comparator 120) to determine whether the sampled voltage satisfies a threshold. In this example, the detection circuit determines whether the sampled voltage is within a predefined voltage range defined by two voltage thresholds—e.g., $+0.4V_{ref}$ and $-0.4V_{ref}$. Moreover, the detection circuit 115 is communicatively coupled to the state machine 125 to indicate to the state machine 125 when the sampled voltage is within the predefined voltage range.

In one example, if the detection circuit 115 determines during the first cycle (which sets the most significant bit (MSB) in the output digital value) that $V_{comp}$ is within a predefined voltage range, the state machine 125 keeps the first capacitor pair 110A coupled to the ground voltage $V_{cm}$ rather than switching these capacitors to couple to either $V_{ref-}$ or $V_{ref+}$. Thus, during the second cycle (which sets the second MSB in the output digital value) the $V_{comp}$ is unchanged. Conversely, if the sampled voltage is outside the predefined voltage range during the first cycle, the state machine 125 switches the capacitor pair 110 as described above to either increase or decrease $V_{comp}$ for the next cycle. As explained in detail below, using the low voltage detection circuit 115 may result in fewer analog subtractions or additions which may improve the accuracy of the analog to digital conversion performed by the ADC 100.

In one example, the ADC 100 includes N-1 pairs of capacitor pairs 110 where N is the number of bits in the digital value outputted by the ADC 100 for each sampled voltage. The values of the capacitors in each pair 110 vary according to the digital bit being measured for the corresponding cycle. That is, the value of the capacitors in the first pair 110A is $2^{N-1}*C$ where C can be any constant capacitance value. The value of the capacitors in the second pair 110B is $2^{N-2}*C$, the value of the capacitors in the third pair 110C is $2^{N-2}*C$, and so forth. Thus, the capacitance values for the capacitor pairs 110 decreases according to a factor of two from left to right. For example, if the ADC 100 outputs four bits (N=4), the values of the first pair of capacitors 110A is 8*C, the second pair 110B is 4*C, and the third pair 110B is 2*C. In this example, for each sampled voltage, the state machine 125 would perform four cycles to generate four digital bits using the capacitor pairs 110.

Figure 2:
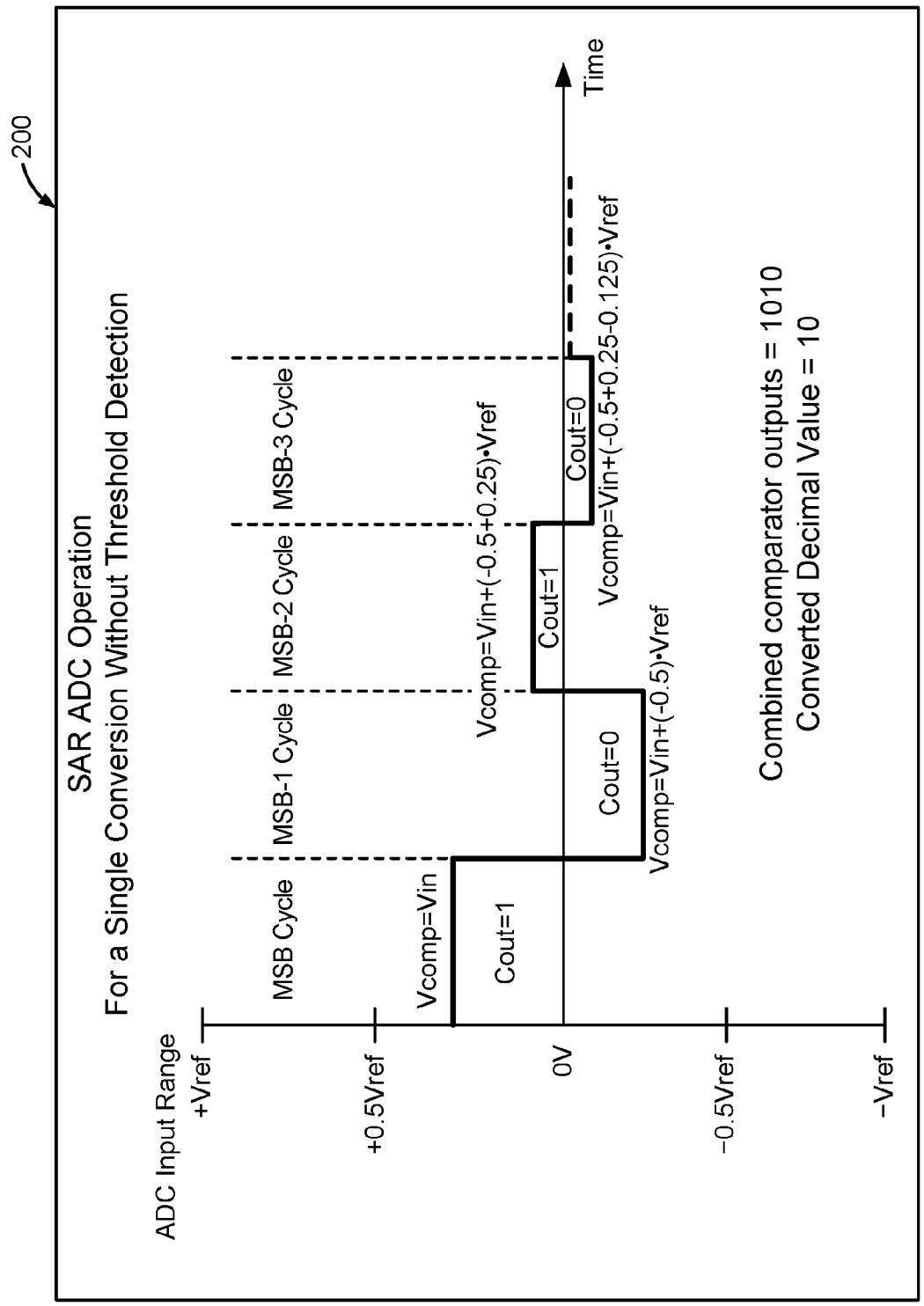
FIG. 2 is a chart illustrating the operation of an ADC according to an example.

FIG. 2 is a chart 200 illustrating the operation of an ADC according to an example. To better understand the operation of the ADC 100 shown in FIG. 1, the chart 200 illustrates how the ADC 100 would operate if the low voltage detection circuit 115 was removed from the ADC 100 (or was deactivated). In this example, it is assumed that the ADC outputs four digital bits, and thus, performs four cycles using three pairs of capacitors.

To determine the MSB of the digital value, the sampled voltage is evaluated by the comparator 120 to determine if this voltage has a negative or positive polarity. In this example, the polarity of $V_{comp}$ is positive which means the output of the comparator $C_{out}$ is a logical one.

Figure 3A:
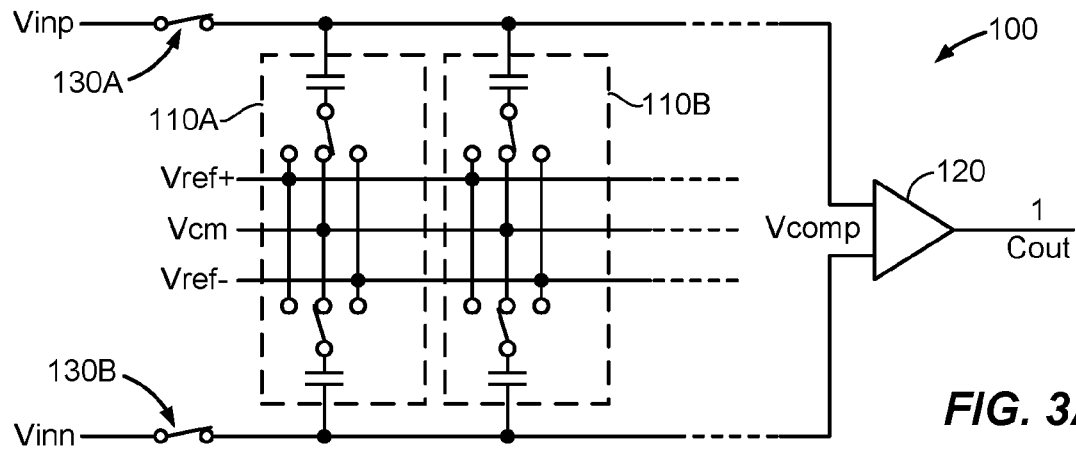
FIGS. 3A-3C illustrates cycles for performing an analog to digital conversion according to an example.
Figure 3B:
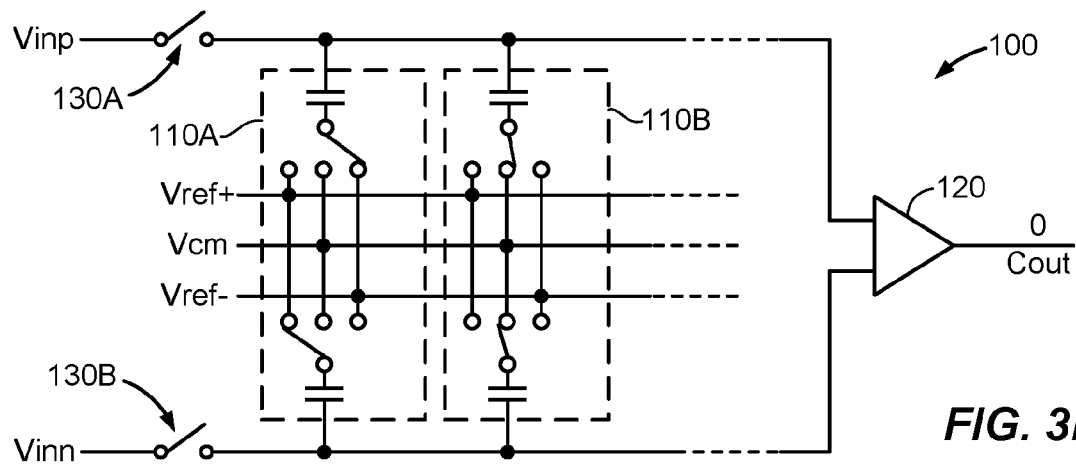
Figure 3C:
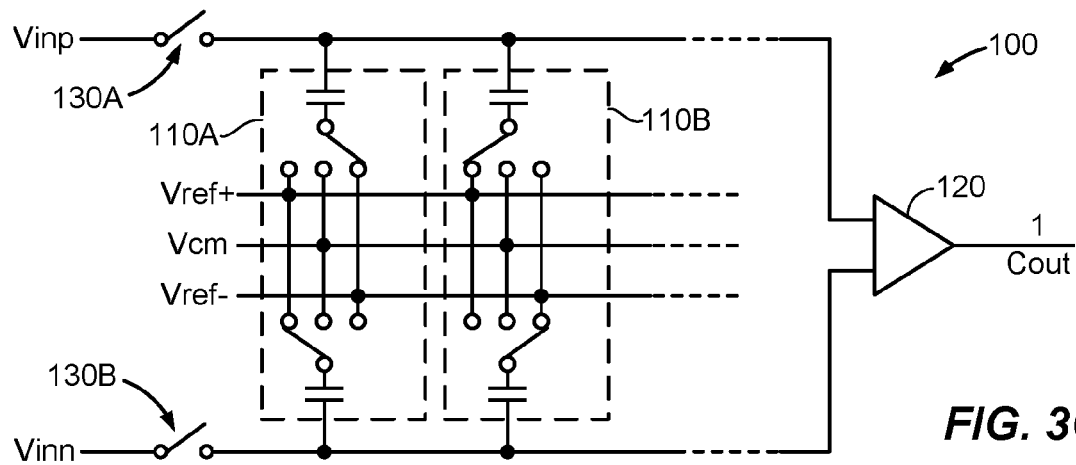

For clarity, FIGS. 3A-3C are described in tandem with chart 200 to illustrate the state of the ADC 100 during the first three cycles. Specifically, FIG. 3A corresponds to the first cycle (i.e., the MSB cycle) in chart 200. Here, the capacitors in each of the pairs 110 are coupled to ground $V_{cm}$—i.e., a default state or reset state. The switches 130A and 130B are closed so that the value of $V_{comp}$ is the same as the sampled voltage of the differential analog signal. As shown in chart 200, $V_p$ has positive polarity, which in this example results in the comparator 120 outputting a logical one which the state machine (not shown) stores as the MSB of the digital output. Moreover, the state machine uses the output of the comparator 120 to determine that the first pair of capacitors 110A should be switched in order to decrease the value of $V_{comp}$. That is, because the polarity of the sampled voltage is positive, the state machine controls the switches coupled to the first pair of capacitors 110A to decrease the sampled voltage.

FIG. 3B illustrates the second cycle of the analog to digital conversion where the state machine has switched the upper capacitor in pair 110A to couple to $V_{ref-}$ and the lower capacitor to couple to $V_{ref+}$. As a result, the pair 110A subtracts $V_{ref}/2$ from $V_{comp}$. This is shown in chart 200 where during the second cycle (i.e., MSB-1 cycle) the value of $V_{comp}$ has decreased by $V_{ref}/2$. Because $V_{comp}$ was less than $V_{ref}/2$, this analog subtraction switches $V_{comp}$ from a positive polarity to a negative polarity during the second cycle. As a result, the comparator 120 outputs a logical zero during the second cycle which the state machine stores as the second MSB of the digital output. In addition, because the output of the comparator 120 is now a zero (indicating the polarity of the sampled voltage is now negative), the state machine switches the next pair of capacitors 110B to increase the voltage $V_{comp}$ for the third cycle.

FIG. 3B illustrates the state of the ADC 100 during third cycle where the state machine has switched the upper capacitor in pair 110B to couple to $V_{ref+}$ and the low capacitor to couple to $V_{ref-}$. As a result, the capacitor pair 110B adds $V_{ref}/4$ to $V_{comp}$. Because the capacitors in pair 110A remain coupled in the same manner as in the second cycle, the two pairs of capacitors 110A and 110B have subtracted $V_{ref}/2$ and added $V_{ref}/4$ to the original sampled voltage. The result of these two analog operations is shown in the third cycle (i.e., MSB-2 cycles) in chart 200. Because $V_{comp}$ again has a positive polarity, the output $C_{out}$ of the comparator 120 is a logical one during the third cycle.

Because the polarity of $V_{comp}$ is positive during the third cycle, the state machine switches a third pair of capacitors (not shown in FIGS. 3A-3C) to subtract $V_{ref}/8$ during the fourth cycle. Thus, the ADC 100 includes N−1 pairs of capacitors for generating the N bit digital output. As shown in chart 200, the resulting digital output for the four cycles is "1010" which is the binary representation of the sampled analog signal. This digital output can be transmitted to other digital circuits (e.g., filters or processors) downstream of the ADC 100.

After completing the four cycles, the state machine resets the capacitor pairs 110 by coupling each of the capacitors to ground Va. The state machine can then close the switches 130A and 130B which permits the ADC 100 to sample a new analog voltage and repeat the analog to digital conversion to output a new digital value.

Figure 4:
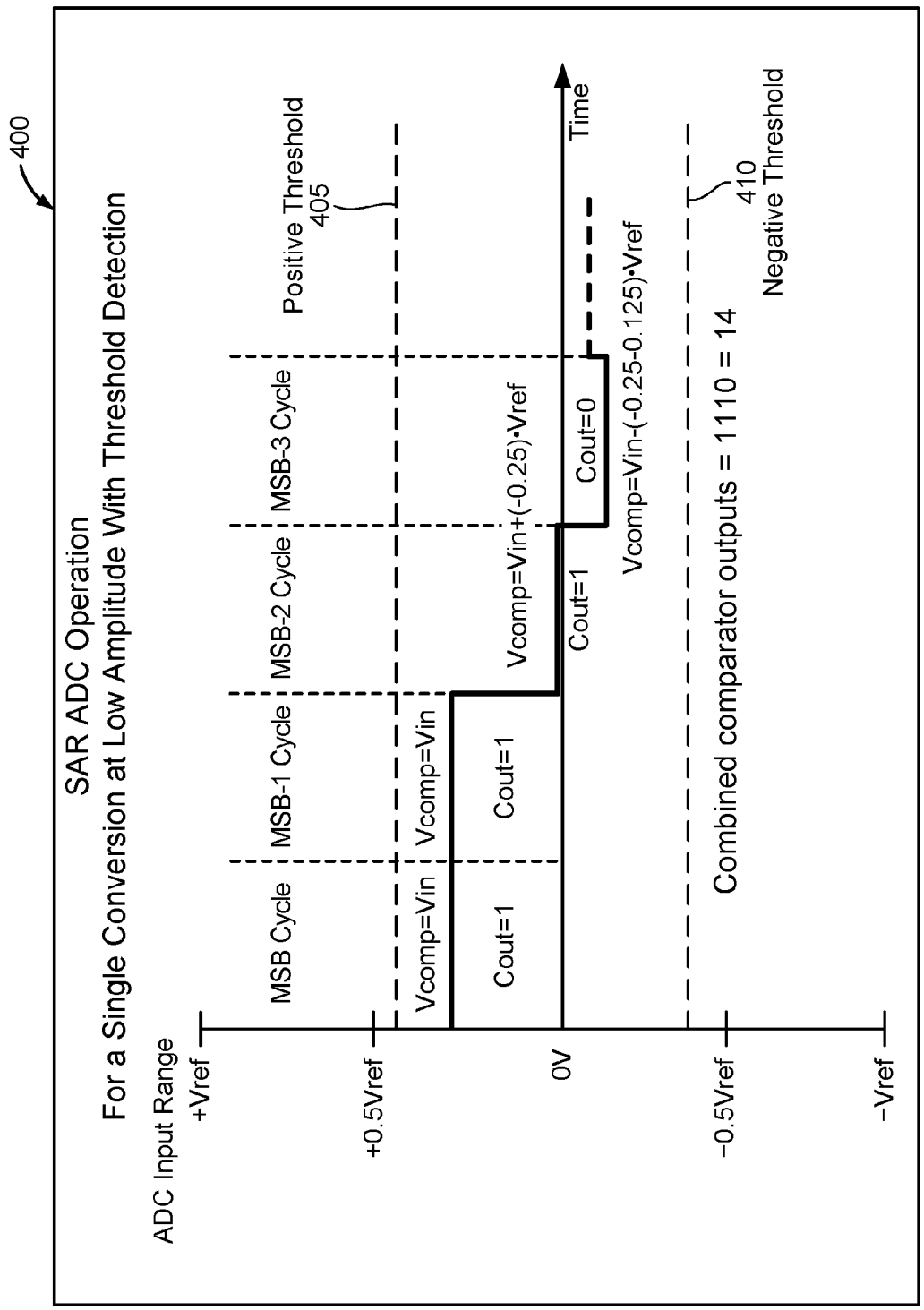
FIG. 4 is a chart illustrating the operation of an ADC according to an example.

FIG. 4 is a chart illustrating the operation of an ADC according to an example. Unlike in chart 200 shown in FIG. 2, chart 400 illustrates the operation of the ADC 100 in FIG. 1 when the low voltage detection circuit 115 is operational. As shown, the low voltage detection circuit 115 compares the sampled voltage—i.e., $V_{comp}$—to a positive threshold 405 and a negative threshold 410 to determine if the sampled voltage is within a voltage range. Put differently, the low voltage detection circuit 115 determines if $V_{comp}$ is between the positive threshold 405 and the negative threshold 410.

Although the detection circuit 115 may indicate to the state machine each cycle whether $V_{comp}$ is between the positive and negative thresholds 405, 410, the state machine may use that information for only a subset of the cycles. That is, the information provided by the low voltage detection circuit 115 may be relevant to the decision making of the state machine during some cycles but not others. In the example shown in FIG. 4, the state machine changes its behavior in response to the output signal of the low voltage detection circuit 115 only during the first cycle—i.e., the MSB cycle. During the other cycles—i.e., MSB-1, MSB-2, etc.—the state machine 125 makes a decision how to switch the capacitor pairs in the next cycle without considering the output of the low voltage detection circuit 115—i.e., its output is ignored. In one example, using the output of the low voltage detection circuit 115 during only a subset of the cycle is desirous since errors in the analog operations performed during the MSB cycles since these analog operations can be the highest absolute error sources relative to the analog operations performed in later cycles. For example, a 0.1% error when subtracting or adding $V_{ref}/2$ from $V_{comp}$ has a much greater effect on the resulting voltage than a 0.1% error when subtracting or adding $V_{ref}/8$ during a later cycle. Moreover, there is a tradeoff with changing the magnitudes of the thresholds 405, 410. If the magnitudes of the thresholds 405, 410 are decreased, fewer input sampled signals benefit from performing digital correction. However, if the magnitudes are increased, fewer cycles of any single conversion benefit from the digital correction.

In chart 400, the sampled voltage during the MSB cycle has the same value as the sampled voltage in chart 200. However, because the low voltage detection circuit 115 determines the value of the sampled voltage (i.e., $V_{comp}$) is between the positive and negative thresholds 405, 410, the state machine does not switch the first capacitor pair 110A. As such, during the MSB-1 cycle, the capacitor pair 110A remains coupled to ground which means the value of $V_{comp}$ has not changed.

The output of the comparator 120 during both the MSB and MSB-1 cycles is a logical one. However, because the state machine 125 determined not to perform an analog operation during the MSB cycle (i.e., the ADC did not subtract $V_{ref}/2$ from $V_{comp}$), the state machine stores an indicator in memory which is used later to perform a digital operation to compensate for not performing the analog subtraction during the first cycle.

Although the value of $V_{comp}$ is still between the positive and negative thresholds during the MSB-1 cycle, in this example, the state machine ignores the output of the low voltage detection circuit 115. Instead, the state machine 125 performs a similar operation as described in chart 200 where the state machine 125 determines if the polarity of $V_{comp}$ is negative or positive using the output of the comparator 120 and switches the corresponding pair of capacitors accordingly. Referring to FIG. 1, because $V_{cm}$ has a positive polarity during the MSB-1 cycle, the state machine switches the upper capacitor in the second capacitor pair 110B to couple to $V_{ref-}$ and the lower capacitor in pair 110B to couple to $V_{ref+}$ thereby subtracting $V_{ref}/4$ from $V_{comp}$. The capacitors in the first pair 110A remain coupled to ground $V_{cm}$, and thus, do not affect $V_{comp}$. As a result of this subtraction, the value of $V_{comp}$ during the third cycle is the original sampled voltage minus $V_{ref}/4$.

Because the polarity of $V_{comp}$ during the MSB-2 cycle is still positive, the state machine switches the upper capacitor in the third capacitor pair 110C to couple to $V_{ref-}$ and the low capacitor in pair 110C to couple to $V_{ref+}$ thereby subtracting $V_{ref}/8$ from the value of $V_{comp}$ during the MSB-2 cycle. Because the value of $V_{comp}$ during the fourth cycle is negative, the comparator outputs a logical zero as the least significant bit of the digital value.

The state machine combines the digital bits outputted by the comparator during the four cycles in FIG. 4 to generate the digital value "1110" (i.e., 14 in base ten) which is different than the digital value "1010" (i.e., 10 in base ten) generated by operating the ADC as shown in FIG. 2. However, because the state machine stored an indicator during the MSB cycle indicating that the analog operation was skipped for that cycle, the state machine (or other hardware logic or firmware) can perform a digital operation to compensate for the skipped analog operation. In this case, because the state machine knows that the polarity of $V_{comp}$ during the MSB cycle was positive, and thus, an analog subtraction of $V_{ref}/2$ should have been performed at the end of this cycle. Subtracting $V_{ref}/2$ during the first cycle in the analog domain (which subtracts one quarter of the total range +/− $V_{ref}$ of the digital value) equates to subtracting four from the digital value in the digital domain since four divided by $2^N$ is one quarter of the total range of the digital output of the ADC.

If, however, during the MSB cycle $V_{comp}$ has a negative polarity and was within the range defined by the negative and positive thresholds 405, 410, then the state machine skips performing an analog addition operation where $V_{ref}/2$ is added to the analog signal during the second cycle. To compensate, the state machine would add 4 to the resulting digital value to yield the correct digital value.

Although FIG. 4 illustrates using the positive threshold 405 and negative threshold 410 only during the first cycle (i.e., the MSB cycle) to change the operation of the state machine, in other examples, the positive threshold 405 and negative threshold 410 can be set to affect the operation of the state machine over multiple cycles. For example, if the thresholds 405 and 410 are set to values less than +/−0.125*$V_{ref}$ (e.g., 0.12*$V_{ref}$ and −0.12*$V_{ref}$, respectively), the state machine can determine whether for the first two cycles if the analog operation should be performed or skipped. Using the example shown in FIG. 4, during the first cycle $V_{comp}$ is greater than the positive threshold 0.12*$V_{ref}$ and thus, the analog operation would be performed. However, during the second cycle, the value of $V_{comp}$ may be less than the negative threshold −0.12*$V_{ref}$ in which case the state machine would keep the capacitors in the second pair 110B coupled to ground rather than adding $V_{ref}/4$ to $V_{comp}$. During the third and fourth cycles, the state machine ignores the output of the low voltage detection circuit, and thus, the thresholds 405 and 410 do not affect the operation of the ADC. To compensate for the skipped analog addition of $V_{ref}/4$ during the second cycle, the state machine adds two to the output of the digital value since 2 divided by $2^N$ is one eighth of the total range of the digital output of the ADC.

In another example, if the sampled voltage during the MSB cycle is between 0.12*$V_{ref}$ and −0.12*$V_{ref}$, then the state machine skips the analog operations for both the MSB and MSB-1 cycles. In this case, the state machine adds or subtracts both a four and a two from the resulting digital value to compensate for the two skipped analog operations. Thus, in this manner, the positive and negative thresholds 405 and 410 can be applied to multiple cycles—e.g., 2, 3, 4, etc.—of the analog to digital conversion. In one example, the state machine stores predefined mappings between analog operations skipped during the multiple cycles to values that are either added or subtracted in the digital domain to correct the resulting digital value.

Figure 5:
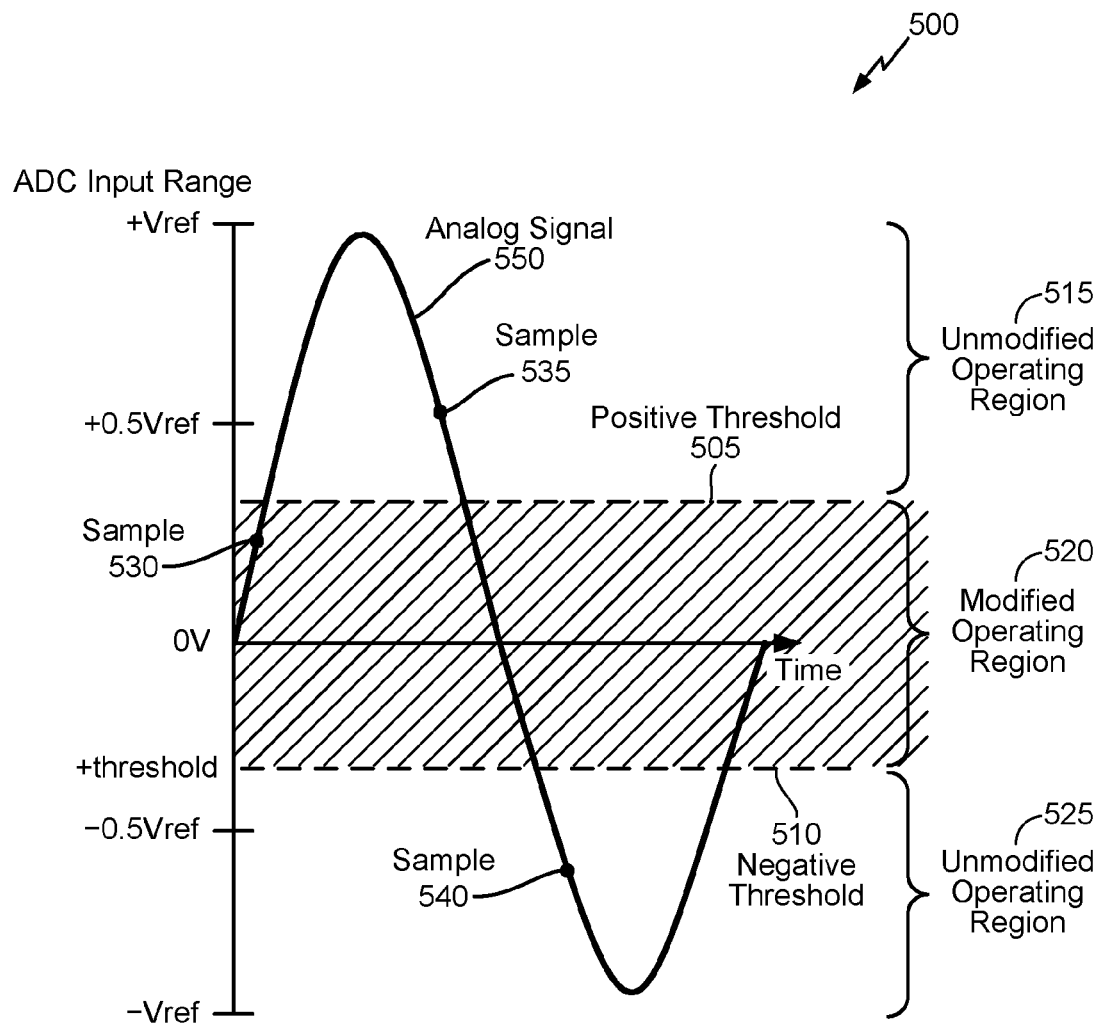
FIG. 5 is a chart illustrating different operating regions of an ADC according to an example.

FIG. 5 is a chart 500 illustrating different operating regions of the ADC 100 shown in FIG. 1 according to an example. As shown, the sine wave represents an analog signal 550 where its amplitude changes over time. The operation of the ADC 100 is divided into three operating regions. When the amplitude of the analog signal 550 is above a positive threshold 505 or below a negative threshold 510, the ADC 100 operates in unmodified operation regions 515 and 525 where the output of the low voltage detection circuit does not affect the operation of the ADC. For example, if the ADC 100 samples the analog signal 550 at sample 535 or sample 540, the received sampled voltage is outside of the voltage range between the positive threshold 505 and the negative voltage threshold 510, and thus, the ADC does not skip any analog operations when generating the digital values corresponding to samples 535 and 540. Instead, at each cycle, the ADC uses the polarity of $V_{comp}$ to determine whether to increase or decrease the value of $V_{comp}$ for the next cycle.

However, if the analog signal 550 is sampled at sample 530, the ADC is in a modified operating region 520 where the voltage of the sampled signal is between the positive threshold 505 and the negative threshold 510. As a result, the low voltage detection circuit outputs a signal that causes the state machine to skip one or more of the analog operations performed in the cycles. In the example shown in FIG. 4, the state machine skips the analog operation corresponding to the MSB cycle but performs the analog operations corresponding to the MSB-1 and MSB-2 cycles. In this way, the low voltage detection circuit modifies the operation performed by the state machine such that an analog operation is replaced by a digital operation after the digital value for the sample 530 is generated.

Figure 6:
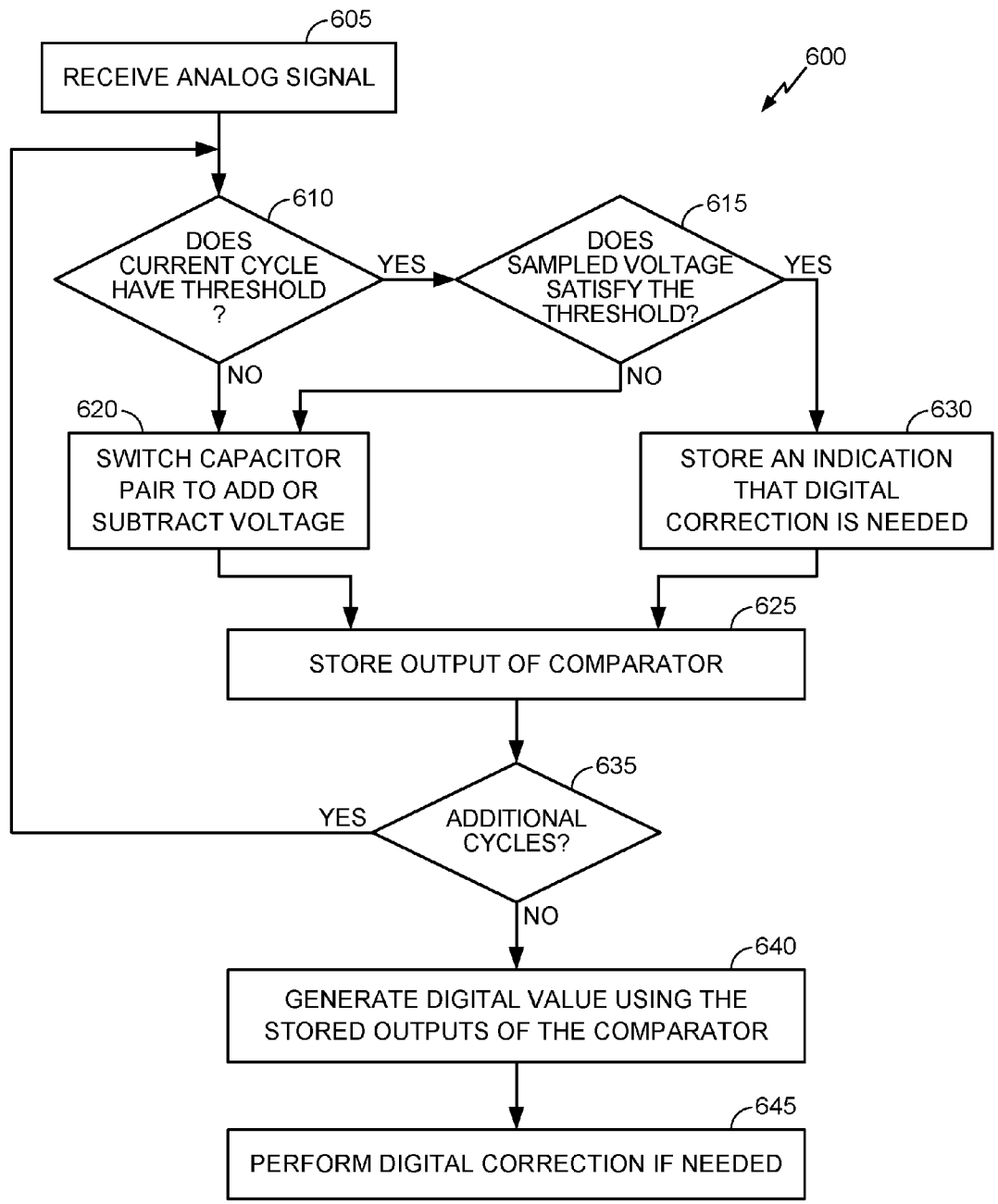
FIG. 6 is a flowchart for operating an ADC using low threshold detection according to an example.

FIG. 6 is a flowchart of a method 600 for operating an ADC using low threshold detection according to an example. At block 605, the ADC receives a sample of an analog signal. Although the examples above illustrate a SAR ADC, this disclosure can be used in other ADCs to replace one or more analog operations (e.g., additions, subtractions, etc.) performed on a sampled voltage to one or more digital operations on a resulting digital value.

At block 610, the state machine in the ADC determines whether the current cycle has a threshold. That is, although the low voltage detection circuit may continually evaluate (e.g., for all the cycles) $V_{comp}$ to determine if this voltage is within a predefined voltage range, the state machine may only consider the output of the low voltage detection circuit for a subset of the cycles (e.g., the MSB cycle and the MSB-1 cycle). During the other cycles, the state machine ignores the output of the low voltage detection circuit. In one example, the low voltage detection circuit includes two comparators that compare $V_{comp}$ to positive and negative thresholds to determine if the current value of $V_{comp}$ is within the predefined threshold.

If the current cycle being evaluated has a threshold, method 600 proceeds to block 615 whether the state machine uses the output of the low voltage detection circuit to determine if the sampled voltage satisfies the threshold (e.g., the voltage is above or below the threshold). As mentioned above, the threshold may be used during the cycles that determine the most significant bits of the sampled voltage since the analog operations performed in these cycles change the sampled voltage for the greatest amount. Thus, any errors in the analog operations have a greater effect on the sampled voltage during the MSB cycles than the remaining LSB cycles. However, using the state machine, the thresholds can be selectively used to decide whether to perform, or skip, the analog operations for any of the cycles, not just the MSBs.

If the state machine determines the current cycle does not have a threshold or that the sampled voltage does not satisfy the threshold, the method 600 proceeds to block 620 where the state machine switches the capacitor pair for the cycle to increase or decrease the sampled voltage (e.g., $V_{comp}$). That is, the state machine performs an analog operation to drive the sampled voltage closer to ground.

However, if at block 615 the state machine determines that $V_{comp}$ satisfies the threshold (or is within the predefined voltage range), method 600 proceeds to block 630 where the state machine stores an indication that digital correction is needed since the analog operation for the current cycle is skipped. Put differently, the state machine maintains the capacitor pair corresponding to the current cycle in the default state—e.g., one side of each of the capacitors is coupled to a common voltage or ground such that the sampled voltage is unchanged. The indication serves as a flag to the state machine that once the digital value is completed—i.e., the ADC has completed all the cycles for the sampled voltage—the state machine should perform a digital operation to compensate for skipping the analog operation of the current cycle. The indicator may be stored in volatile or non-volatile memory element in the state machine or elsewhere in the ADC or an integrated circuit containing the ADC.

At block 625, the state machine stores an output of the comparator for the current cycle. In one example, the state machine uses the output of the comparator to store a single bit of the digital value each cycle. If the ADC has ten cycles, then the resulting digital value has ten bits. Thus, for each sampled voltage, the ADC outputs a ten-bit digital value representing the sampled analog voltage.

At block 635, the state machine determines if there is an additional cycle (or cycles) remaining to generate the digital value for the sampled analog voltage. If so, method 600 returns to block 610, but if not, method 600 proceeds to block 640 where the state machine generates the digital value using the stored outputs (i.e., digital bits) of the comparator.

At block 645, the state machine performs a digital correction of the digital value if needed. That is, if for any of the cycles the state machine performed block 630 where the analog operation for the cycle was skipped, the state machine uses the indication to perform a digital operation that corresponds to the skipped analog operation. Thus, the same change in the digital value is performed except that the digital operation does not suffer from the same conditions that can cause errors in the analog operations—e.g., non-ideal capacitor values, settling errors, charge injection, disturbances in reference voltages, and/or temperature variations. However, if the state machine never performed block 630—i.e., none of the analog operations were skipped—the state machine does not need to perform the digital correction and the digital value generated at block 640 can be sent to other digital circuitry.

Figure 7A:
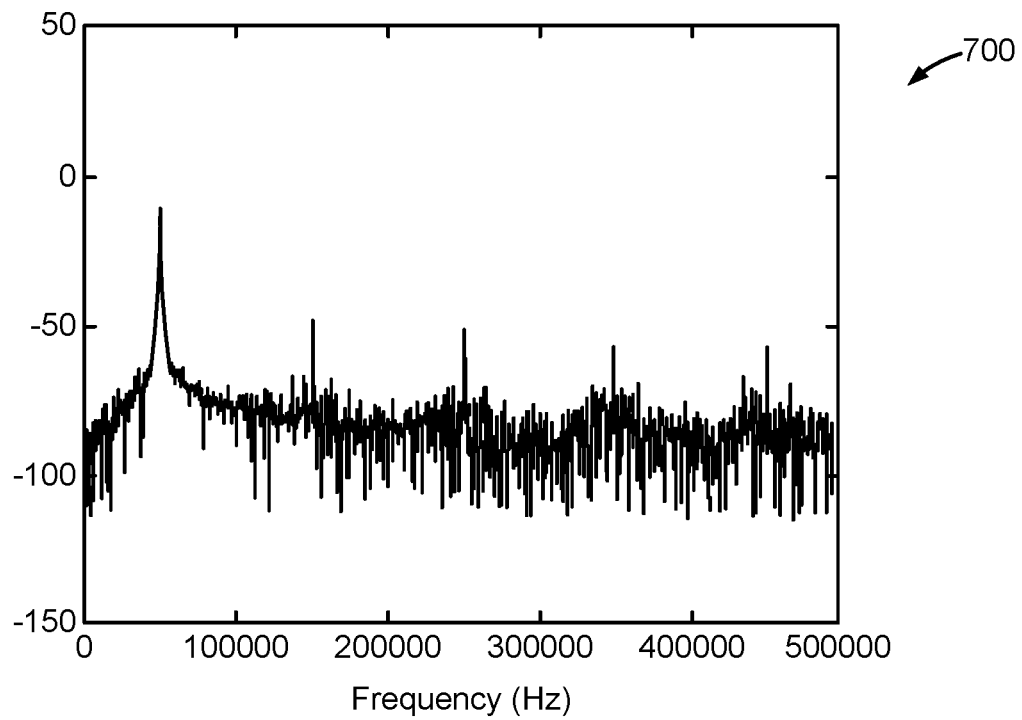
FIGS. 7A and 7B are charts illustrating using low threshold detection in an ADC according to an example.
Figure 7B:
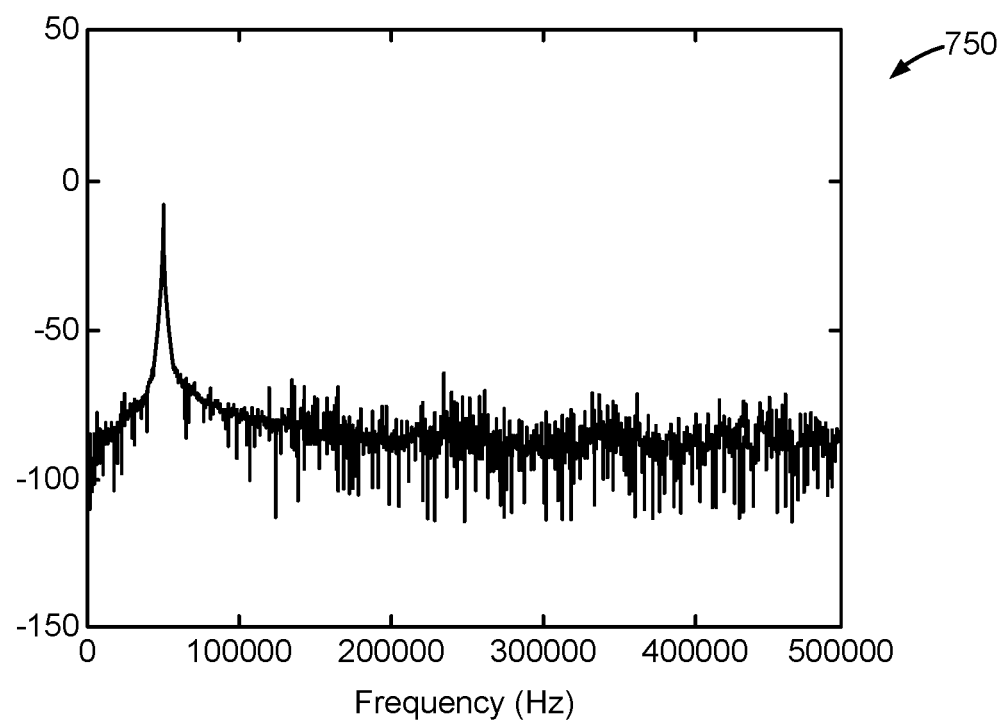

FIGS. 7A and 7B are charts illustrating using low threshold detection in an ADC according to an example. The chart 700 in FIG. 7A illustrates the frequency response of the ADC that operates as shown in FIG. 2 where the low voltage detection circuit is inactive, and thus, the analog operations in each of the cycles are performed. Put differently, the ADC operates in the unmodified operating range regardless of the amplitude of the sampled voltage. As a result, the errors in the analog operation affect the resulting digital value. In this example, the analog signal is attenuated by −32 dB from its full scale value with an assumed 0.1% error in the analog operations.

The chart 750 in FIG. 7B illustrates the same frequency response as in chart 700 except that the ADC operates as shown in FIGS. 5 and 6 where for at least one of the cycles the sampled voltage is within a predefined voltage range. As such, the state machine skips the corresponding analog operation for that cycle or cycles. By comparing charts 700 and 750, operating in the modified operation region results in a decrease in the amplitude of the harmonic signals in the frequency response which improves the accuracy of the ADC.

While the foregoing is directed to specific examples, other and further examples may be devised without departing from the basic scope thereof, and the scope thereof is determined by the claims that follow.

What is claimed is:

1. An analog to digital converter (ADC), comprising:
   a comparator;
   a plurality of capacitor pairs coupled between a first input and a second input of the comparator, wherein each one of the capacitor pairs corresponds to one of a plurality of cycles used by the ADC to generate a digital value representing a sampled analog voltage;
   a voltage detection circuit coupled between the first and second inputs; and
   a state machine configured to:
   upon determining during a first cycle of the plurality of cycles that the voltage detection circuit indicates the sampled analog voltage across the first and second inputs satisfies a threshold, maintaining a first pair of the plurality of capacitor pairs corresponding to the first cycle in a reset state such that the sampled analog voltage is unchanged; and
   upon determining during the first cycle that the voltage detection circuit indicates the sampled analog voltage across the first and second inputs does not satisfy the threshold, switching the first pair of the plurality of capacitor pairs to change the sampled analog voltage.

2. The ADC of claim 1, wherein the state machine is configured to:
   upon determining during a second cycle of the plurality of cycles that the voltage detection circuit indicates the sampled analog voltage across the first and second inputs satisfies the threshold, maintaining a second pair of the plurality of capacitor pairs corresponding to the second cycle in the reset state such that the sampled analog voltage is unchanged; and upon determining during the second cycle that the voltage detection circuit indicates the sampled voltage across the first and second inputs does not satisfy the threshold, switch the second pair of the plurality of capacitor pairs to change the sampled analog voltage.

3. The ADC of claim 1, wherein a value of the two capacitors in each of the capacitors pairs is the same, and wherein the values for each of the capacitor pairs is different relative to the values of the other capacitor pairs.

4. The ADC of claim 1, wherein switching the first pair of the plurality of capacitor pairs performs an analog operation on the sampled analog voltage, and wherein maintaining the first pair of the plurality of capacitors in the reset state skips the analog operation.

5. The ADC of claim 4, wherein upon determining during the first cycle that the voltage detection circuit indicates the sampled analog voltage across the first and second inputs satisfies the threshold, the state machine is configured to:
store an indication that digital correction of the digital value is needed.

6. The ADC of claim 5, wherein the state machine is configured to:
upon determining all of the plurality of cycles have been performed, perform a digital operation on the digital value to compensate for skipping the analog operation during the first cycle.

7. The ADC of claim 1, wherein the state machine is configured to:
evaluate an output of the voltage detection circuit during only a subset of the plurality of cycles to determine whether to maintain one or more of the plurality of capacitor pairs in the reset state, wherein the output of the voltage detection circuit is ignored during a remainder of the plurality of cycles.

8. The ADC of claim 1, wherein the ADC is a successive approximation register ADC.

9. An integrated circuit, comprising:
a comparator;
a plurality of capacitor pairs coupled between a first input and a second input of the comparator, wherein each one of the capacitor pairs corresponds to one of a plurality of cycles used to generate a digital value representing a sampled analog voltage;
a voltage detection circuit coupled between the first and second inputs; and
a state machine configured to:
upon determining during a first cycle of the plurality of cycles that the voltage detection circuit indicates the sampled analog voltage across the first and second inputs satisfies a threshold, maintaining a first pair of the plurality of capacitor pairs corresponding to the first cycle in a reset state such that the sampled analog voltage is unchanged; and
upon determining during the first cycle that the voltage detection circuit indicates the sampled analog voltage across the first and second inputs does not satisfy the threshold, switch the first pair of the plurality of capacitor pairs to change the sampled analog voltage.

10. The integrated circuit of claim 9, wherein the state machine is configured to:
upon determining during a second cycle of the plurality of cycles that the voltage detection circuit indicates the sampled analog voltage across the first and second inputs satisfies the threshold, maintaining a second pair of the plurality of capacitor pairs corresponding to the second cycle in the reset state such that the sampled analog voltage is unchanged; and upon determining during the second cycle that the voltage detection circuit indicates the sampled voltage across the first and second inputs does not satisfy the threshold, switching the second pair of the plurality of capacitor pairs to change the sampled analog voltage.

11. The integrated circuit of claim 9, wherein a value of the two capacitors in each of the capacitors pairs is the same, and wherein the values for each of the capacitor pairs is different relative to the values of the other capacitor pairs.

12. The integrated circuit of claim 9, wherein switching the first pair of the plurality of capacitor pairs performs an analog operation on the sampled analog voltage, and wherein maintaining the first pair of the plurality of capacitors in the reset state skips the analog operation.

13. The integrated circuit of claim 12, wherein upon determining during the first cycle that the voltage detection circuit indicates the sampled analog voltage across the first and second inputs satisfies the threshold, the state machine is configured to:
store an indication that digital correction of the digital value is needed.

14. The integrated circuit of claim 13, wherein the state machine is configured to:
upon determining all of the plurality of cycles have been performed, perform a digital operation on the digital value to compensate for skipping the analog operation during the first cycle.

15. The integrated circuit of claim 9, wherein the state machine is configured to:
evaluate an output of the voltage detection circuit during only a subset of the plurality of cycles to determine whether to maintain one or more of the plurality of capacitor pairs in the reset state, wherein the output of the voltage detection circuit is ignored during a remainder of the plurality of cycles.

16. The integrated circuit of claim 9, wherein the comparator, the plurality of capacitor pairs, the voltage detection circuit and the state machine form a successive approximation register ADC.

17. A method, comprising:
receiving a first sampled analog voltage at a first input and a second input of a comparator in an ADC, wherein a plurality of capacitor pairs are coupled between the first and second inputs of the comparator, and wherein each one of the capacitor pairs corresponds to one of a first plurality of cycles used by the ADC to generate a digital value representing the first sampled analog voltage;
upon determining during a first cycle of the first plurality of cycles that the first sampled analog voltage satisfies a threshold, maintaining a first pair of the plurality of capacitor pairs corresponding to the first cycle in a reset state such that the first sampled analog voltage is unchanged;
receiving a second sampled analog voltage at the first and second inputs of the comparator; and
upon determining during a first cycle of a second plurality of cycles that the second sampled analog voltage does not satisfy the threshold, switching the first pair of the plurality of capacitor pairs to change the second sampled analog voltage.

18. The method of claim 17, further comprising:
upon determining during a second cycle of the first plurality of cycles that the first sampled analog voltage across the first and second inputs satisfies the threshold, maintaining a second pair of the plurality of capacitor pairs corresponding to the second cycle in the reset state such that the first sampled analog voltage is unchanged.

19. The method of claim 17, wherein switching the first pair of the plurality of capacitor pairs performs an analog operation on the second sampled analog voltage, and wherein maintaining the first pair of the plurality of capacitors in the reset state skips the analog operation.

20. The method of claim 19, further comprising:
upon determining all of the first plurality of cycles have been performed, performing a digital operation on the digital value to compensate for skipping the analog operation during the first cycle of the first plurality of cycles.

* * * * *